US009859007B2

(12) United States Patent
Suzuki et al.

(10) Patent No.: US 9,859,007 B2
(45) Date of Patent: Jan. 2, 2018

(54) NON-VOLATILE MEMORY DEVICE HAVING MULTIPLE STRING SELECT LINES

(71) Applicant: MACRONIX INTERNATIONAL CO., LTD., Hsin-chu (TW)

(72) Inventors: Atsuhiro Suzuki, Hsinchu (TW); Chih-Wei Lee, New Taipei (TW); Shaw-Hung Ku, Hsinchu (TW)

(73) Assignee: MACRONIX INTERNATIONAL CO., LTD., Hsin-Chu (TW)

( * ) Notice: Subject to any disclaimer, the term of this patent is extended or adjusted under 35 U.S.C. 154(b) by 0 days.

(21) Appl. No.: 14/742,054

(22) Filed: Jun. 17, 2015

(65) Prior Publication Data

US 2016/0372202 A1 Dec. 22, 2016

(51) Int. Cl.
*G11C 16/04* (2006.01)
*G11C 16/10* (2006.01)
*G11C 16/34* (2006.01)

(52) U.S. Cl.
CPC .......... *G11C 16/10* (2013.01); *G11C 16/0483* (2013.01); *G11C 16/3427* (2013.01)

(58) Field of Classification Search
CPC .............................. G11C 16/10; G11C 16/0483
See application file for complete search history.

(56) References Cited

U.S. PATENT DOCUMENTS

| | | | | |
|---|---|---|---|---|
| 5,590,072 A | * | 12/1996 | Choi | G11C 16/0483 257/E21.69 |
| 8,867,280 B2 | | 10/2014 | Park et al. | |
| RE45,890 E | * | 2/2016 | Itagaki | |
| 2010/0118606 A1 | * | 5/2010 | Lee | G11C 11/5628 365/185.03 |
| 2011/0235421 A1 | * | 9/2011 | Itagaki | G11C 16/0483 365/185.17 |
| 2013/0069152 A1 | | 3/2013 | Lee et al. | |
| 2013/0258771 A1 | * | 10/2013 | Lee | G11C 16/24 365/185.02 |
| 2014/0233315 A1 | | 8/2014 | Park et al. | |
| 2015/0054057 A1 | | 2/2015 | Hung et al. | |
| 2015/0098274 A1 | | 4/2015 | Rhie | |

* cited by examiner

*Primary Examiner* — Khamdan Alrobaie
(74) *Attorney, Agent, or Firm* — Alston & Bird LLP

(57) ABSTRACT

Methods and apparatuses are contemplated herein for enhancing the program performance of nonvolatile memory devices. In an example embodiment, a nonvolatile memory device comprises a 3D array of nonvolatile memory cells including a plurality of layers, each layer comprising NAND strings of nonvolatile memory cells, the NAND strings coupled to a bit line, and a plurality SSLs and word lines, the SSLs and the word lines arranged orthogonally to the NAND strings, the word lines establishing the nonvolatile memory cells at cross-points between surfaces of the plurality of NAND strings and the word lines, each of the NAND strings further comprising a plurality of SSL transistors coupling the SSLs to the NAND strings, wherein at least a first SSL being configured to receive a first voltage and a second SSL configured to receive at second voltage, and wherein the second SSL being nearer to the word lines.

23 Claims, 17 Drawing Sheets

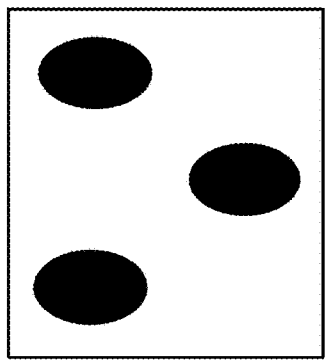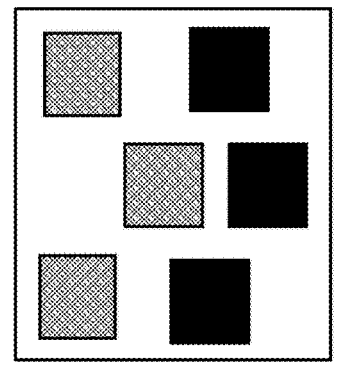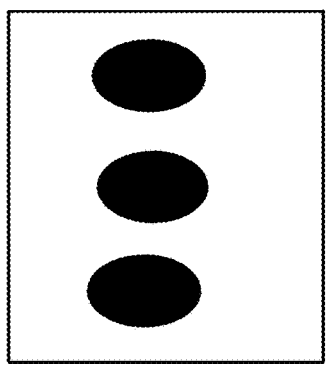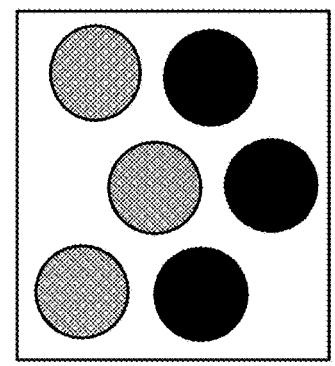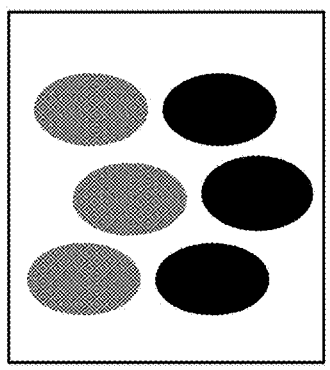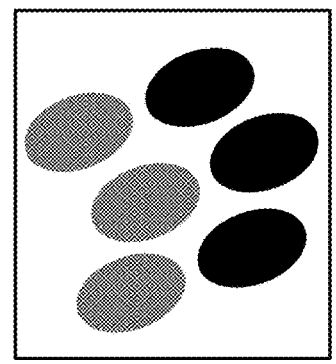
FIG. 16A          FIG. 16B

NON-VOLATILE MEMORY DEVICE HAVING MULTIPLE STRING SELECT LINES

TECHNOLOGICAL FIELD

Example embodiments of the present invention relate generally to non-volatile memory devices and, more particularly, to high density non-volatile memory devices in which multiple planes of memory cells are arranged to provide a three-dimensional 3D array.

BACKGROUND

Semiconductor devices are typically classified as either volatile semiconductor devices, which require power to maintain storage of data, or non-volatile semiconductor devices, which can retain data even upon removal of a power source. An example non-volatile semiconductor device is a flash memory device, which generally includes a matrix of memory cells arranged in rows and columns. Each memory cell in the matrix includes a transistor structure having a gate, a drain, a source, and a channel defined between the drain and the source. Each memory cell is located at an intersection between a word line and a bit line, wherein the gate is connected to the word line, the drain is connected to the bit line, and the source is connected to a source line, which in turn is connected to common ground. The gate of a conventional flash memory cell generally comprises a dual-gate structure, including a control gate and a floating gate, wherein the floating gate is suspended between two oxide layers to trap electrons that program the cell.

Flash memory devices may in turn be classified as NOR or NAND flash memory devices. Of these, NAND flash memory typically offers faster program and erase speeds, in large part due to its serialized structure, whereby program and erase operations may be performed on entire strings of memory cells.

However, given that the usage of NAND flash memory has increased significantly, there are some markets in which high performance read operations and data retention are becoming more important than program performance. For instance, high read cycles and good data retention are required for game cards, and automotive GPS systems, among other markets. Thus, there is a growing need for NAND flash memory devices that demonstrate greater data retention and read performance while maintaining the faster program and erase speeds.

NAND flash memory devices program memory cells using Fowler-Nordheim tunneling, which can pull electrons from a substrate into a floating gate and fill its traps due to high voltage (or potential) drop between a word line and the substrate. When electrons fill these traps, the potential barrier between the oxide layers and the floating gate increases. While future program operations will continue to apply the same charge to the memory cell as past program operations, the increased potential barrier of the oxide layers reduces the charge added to the floating gate during a program operation, and thus results in a high threshold voltage of the memory devices.

Some attempts to improve performance have focused on avoiding disturbances to memory cells. Specifically, flash memory devices are susceptible to memory corruption over time as a result of repeated program and read operations, which can cause "disturbs" to memory cells that are not the subject of the program or read operations. For instance, when performing a program operation of a memory cell in a selected word line, a program voltage (Vpgm) is applied to the selected word line while a pass voltage (Vpass) is applied to the unselected word lines. The pass voltage applied to the unselected word lines must be sufficiently high that the boost will be also high enough to last for the entire program operation, while too high a value increases the probability that cells sharing the same string of the selected cell will suffer a program operation.

Thus, to avoid disturbs, some efforts have attempted to adjust the operating conditions of the nonvolatile memory device by reducing the pass voltage to a level less likely to cause read disturbs. However, decreasing the pass voltage requires a decrease in the program verify (PV) voltage threshold to retain a similar pass voltage window (the range of pass voltages that largely avoid read disturbs and program disturbs). Reducing the pass voltage hinders the memory window of the nonvolatile memory device.

Accordingly, there is a need in the art to increase the performance of program operations of a non-volatile memory device.

BRIEF SUMMARY OF EXEMPLARY EMBODIMENTS

In accordance with embodiments of the present invention, a nonvolatile memory device is provided that can avoid the occurrence of program disturbance and enlarge a memory window, the nonvolatile memory device comprising a plurality of string select lines.

As noted above, during a program operation, NAND flash memory devices unselected bit-lines shared by the same word lines will have unwanted electrons pulled in its floating gate at the same time, and when electrons fill these traps, the potential barrier of the oxide layers increase and eventually program operations will produce a high threshold voltage for a "1" state memory cell. To counteract this effect, embodiments disclosed herein apply a coupling effect to a memory cell, which increases the potential of the substrate of the unselected memory strings. By counterbalancing the high program voltage (Vpgm) applied at word lines during program operations, this mechanism can improve the duration that the memory cell retains data and continue to provide accurate read performance.

In some embodiments, an apparatus for controlling a non-volatile memory device may be provided, the apparatus comprising a 3D array of nonvolatile memory cells, the 3D array including a plurality of layers, each layer comprising (1) a plurality of NAND strings of nonvolatile memory cells, each of plurality of NAND strings coupled to a bit line and (2) a plurality of string select lines (SSL) and one or more word lines, the plurality of SSLs and the one or more word lines arranged orthogonally to the plurality of NAND strings, the one more word lines establishing the nonvolatile memory cells at cross-points between surfaces of the plurality of stacks and the one or more word lines, each of the plurality of NAND strings further comprising a plurality of string-select-line (SSL) transistors coupling the SSLs to the NAND strings, wherein at least a first SSL being configured to receive a first voltage and a second SSL configured to receive a second voltage, and wherein the second SSL being nearer to the one or more word lines.

In some embodiments, the apparatus further comprises a control circuit configured to program inhibit cells sharing a word line and not sharing a bit line, the bit lines having a different bias, by applying a first voltage to the first SSL and a second voltage to the second SSL, the second SSL being nearer to the word line, and the first voltage being 0 voltage and the second voltage being lower than the VDD voltage and greater than 0.

In some embodiments, the apparatus further comprises a control circuit configured to program (inhibit) cells sharing a word line and sharing the bitline, the bit line being VDD, by applying a first voltage to the first SSL transistor and a second voltage to the second SSL, the second SSL being nearer to the word line, and the first voltage being VDD voltage and the second voltage being lower than the VDD voltage and greater than 0

In some embodiments, the apparatus further comprises a control circuit configured to program (inhibit) cells sharing a word line and sharing the bitline, the bit line being 0, by applying a first voltage to the first SSL transistor and a second voltage to the second SSL, the second SSL being nearer to the word line, and the first voltage being 0 voltage and the second voltage being lower than the VDD voltage and greater than 0.

In some embodiments, the non-volatile memory device is a vertical channel-type three-dimensional semiconductor memory device comprising a substrate and a plurality of through-holes.

In some embodiments, each of the plurality of NAND strings of nonvolatile memory cells memory cells being associated with an even bit line or an odd bit line, and each of the plurality of NAND strings associated with the even bit line can be programmed independent of the plurality of NAND strings associated with the odd bit line.

In some embodiments, the non-volatile memory device comprises a flash memory. In some embodiments, the non-volatile memory device comprises a NAND flash memory. In some embodiments, the apparatus further comprises a 3D NAND device comprising at least one of an n-type doped substrate formed by n-type dopant implantation, a p-type doped substrate, or an undoped substrate.

In some embodiments, a non-volatile memory device may be provided, the non-volatile memory device comprising a 3D array of nonvolatile memory cells, the 3D array including a plurality of layers, each layer comprising (1) a plurality of NAND strings of nonvolatile memory cells, each of plurality of NAND strings coupled to a bit line and (2) a plurality of string select lines (SSL) and one or more word lines, the plurality of SSLs and the one or more word lines arranged orthogonally to the plurality of NAND strings, the one more word lines establishing the nonvolatile memory cells at cross-points between surfaces of the plurality of stacks and the one or more word lines, each of the plurality of NAND strings further comprising a plurality of string-select-line (SSL) transistors coupling the SSLs to the NAND strings, wherein at least a first SSL being configured to receive a first voltage and a second SSL configured to receive a second voltage, and wherein the second SSL being nearer to the one or more word lines.

In some embodiments, the nonvolatile memory further comprises a control circuit configured to program inhibit cells sharing a word line and not sharing a bit line, the bit lines having a different bias, by applying a first voltage to the first SSL and a second voltage to the second SSL, the second SSL being nearer to the word line, and the first voltage being 0 voltage and the second voltage being lower than the VDD voltage and greater than 0.

In some embodiments, the nonvolatile memory further comprises a control circuit configured to program (inhibit) cells sharing a word line and sharing the bitline, the bit line being VDD, by applying a first voltage to the first SSL transistor and a second voltage to the second SSL, the second SSL being nearer to the word line, and the first voltage being VDD voltage and the second voltage being lower than the VDD voltage and greater than 0

In some embodiments, the nonvolatile memory further comprises a control circuit configured to program (inhibit) cells sharing a word line and sharing the bitline, the bit line being 0, by applying a first voltage to the first SSL transistor and a second voltage to the second SSL, the second SSL being nearer to the word line, and the first voltage being 0 voltage and the second voltage being lower than the VDD voltage and greater than 0.

In some embodiments, the non-volatile memory device is a vertical channel-type three-dimensional semiconductor memory device comprising a substrate and a plurality of through-holes.

In some embodiments, each of the plurality of NAND strings of nonvolatile memory cells memory cells being associated with an even bit line or an odd bit line, and each of the plurality of NAND strings associated with the even bit line can be programmed independent of the plurality of NAND strings associated with the odd bit line.

In some embodiments, the nonvolatile memory device comprises a flash memory. In some embodiments, the non-volatile memory device comprises a NAND flash memory. In some embodiments, the nonvolatile memory further comprises a 3D NAND device comprising at least one of an n-type doped substrate formed by n-type dopant implantation, a p-type doped substrate, or an undoped substrate.

In some embodiments, a method for controlling a non-volatile memory device may be provided, the method comprising providing a nonvolatile memory device that includes a 3D array of nonvolatile memory cells, the 3D array including a plurality of layers, each layer comprising (1) a plurality of NAND strings of nonvolatile memory cells, each of plurality of NAND strings coupled to a bit line and (2) a plurality of string select lines (SSL) and one or more word lines, the plurality of SSLs and the one or more word lines arranged orthogonally to the plurality of NAND strings, the one more word lines establishing the nonvolatile memory cells at cross-points between surfaces of the plurality of stacks and the one or more word lines, each of the plurality of NAND strings further comprising a plurality of string-select-line (SSL) transistors coupling the SSLs to the NAND strings, wherein at least a first SSL being configured to receive a first voltage and a second SSL configured to receive a second voltage, and wherein the second SSL being nearer to the one or more word lines.

In some embodiments, the may further comprise providing a control circuit configured to program inhibit cells sharing a word line and not sharing a bit line, the bit lines having a different bias, by applying a first voltage to the first SSL and a second voltage to the second SSL, the second SSL being nearer to the word line, and the first voltage being 0 voltage and the second voltage being lower than the VDD voltage and greater than 0.

In some embodiments, the may further comprise providing a control circuit configured to program (inhibit) cells sharing a word line and sharing the bitline, the bit line being VDD, by applying a first voltage to the first SSL transistor and a second voltage to the second SSL, the second SSL being nearer to the word line, and the first voltage being VDD voltage and the second voltage being lower than the VDD voltage and greater than 0

In some embodiments, the may further comprise providing a control circuit configured to program (inhibit) cells sharing a word line and sharing the bitline, the bit line being 0, by applying a first voltage to the first SSL transistor and a second voltage to the second SSL, the second SSL being nearer to the word line, and the first voltage being 0 voltage and the second voltage being lower than the VDD voltage and greater than 0.

In some embodiments, the providing of the non-volatile memory device further comprises providing a 3D NAND device comprising at least one of an n-type doped substrate formed by n-type dopant implantation, a p-type doped substrate, or an undoped substrate.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE SEVERAL VIEWS OF THE DRAWINGS

Figure 1:
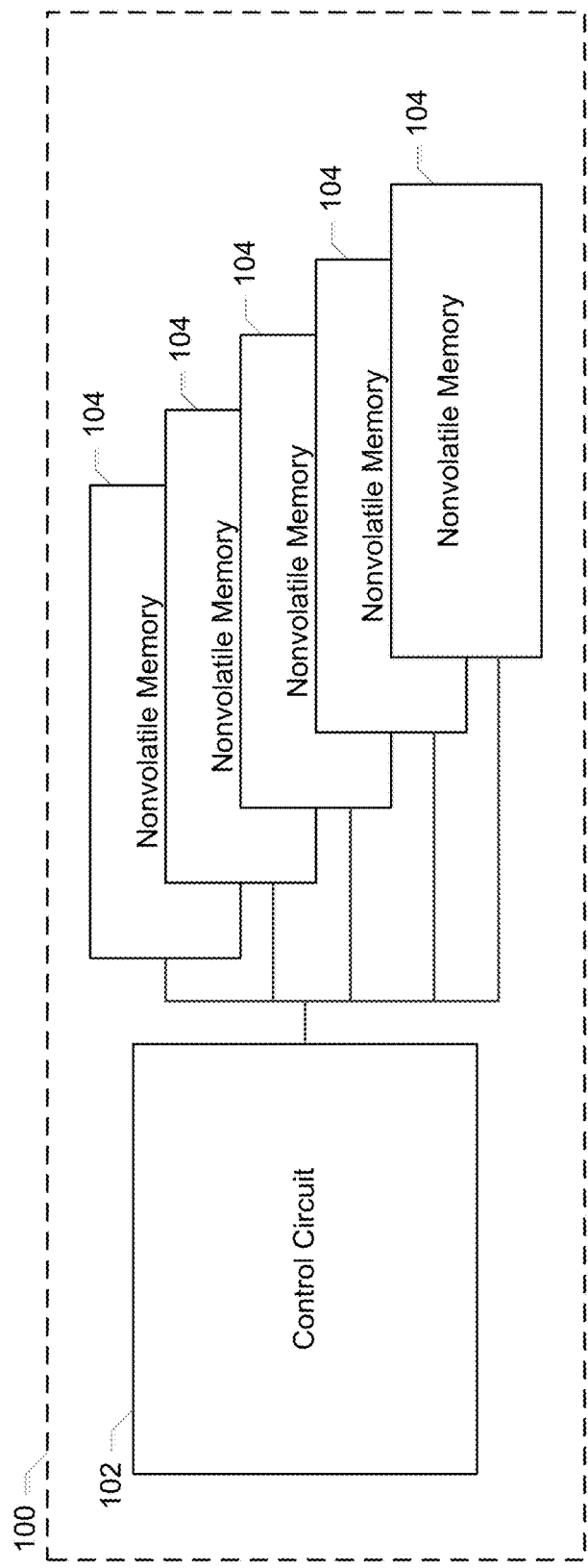

Having thus described certain example embodiments of the present disclosure in general terms, reference will now be made to the accompanying drawings, which are not necessarily drawn to scale, and wherein:

FIG. 1 illustrates a block diagram of a semiconductor device including a control circuit and a series of nonvolatile memory elements, in accordance with example embodiments of the present invention.

Figures 2A, 2B:
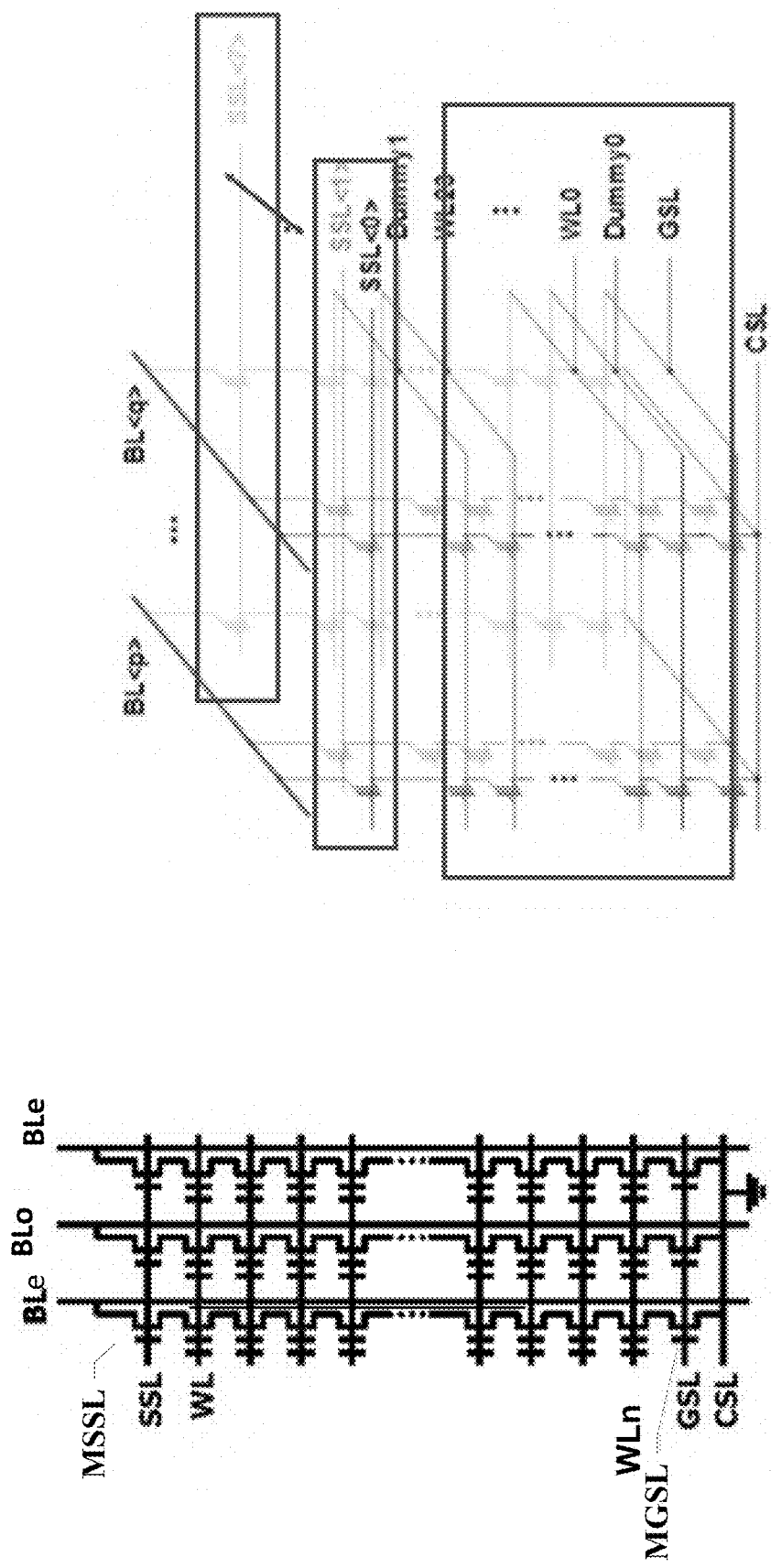
Figure 4:
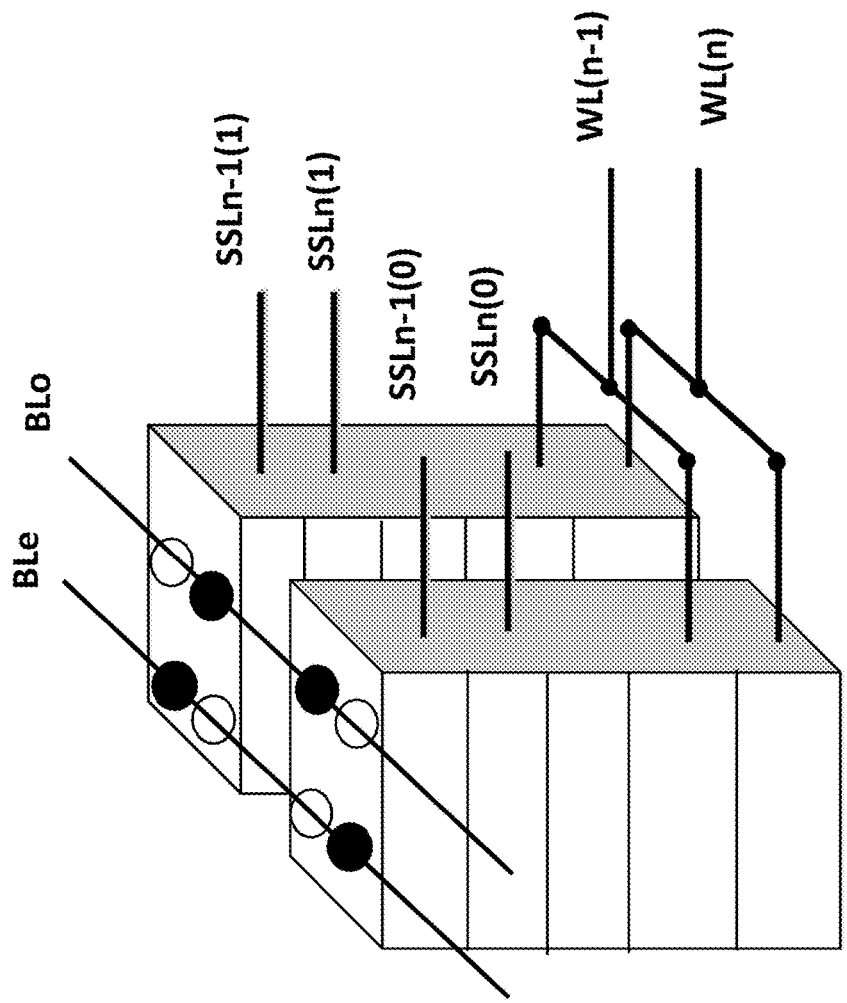
Figure 3:
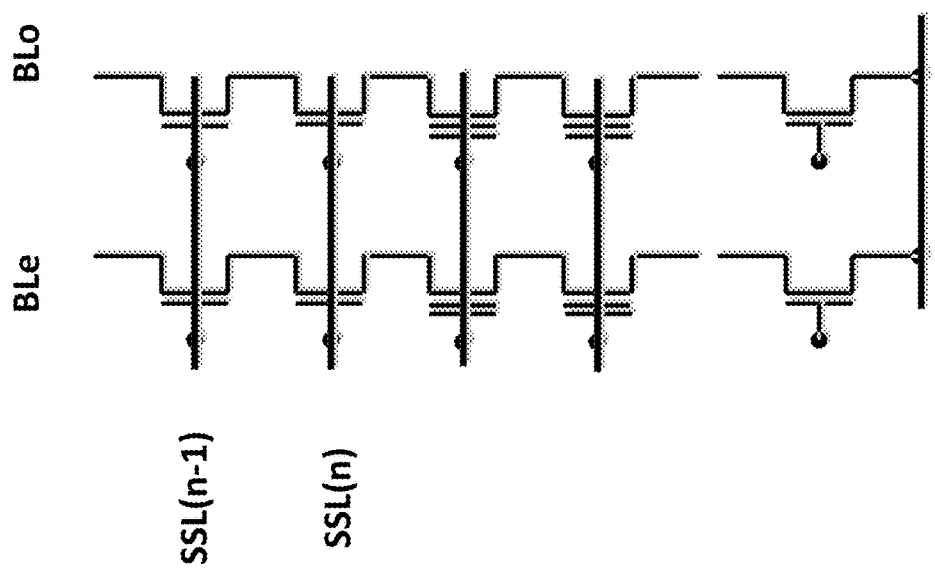
Figures 5A, 5B:
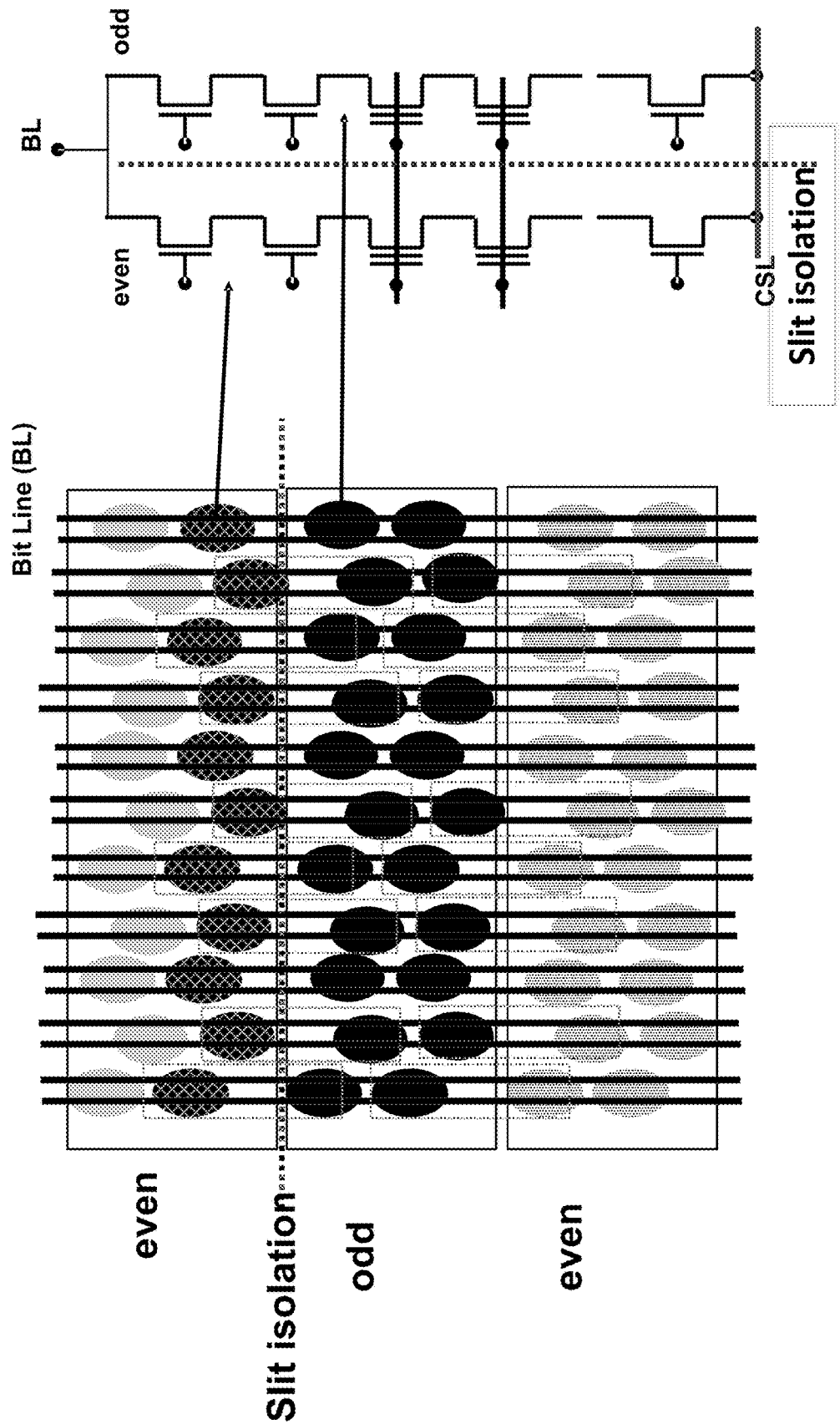
Figure 6:
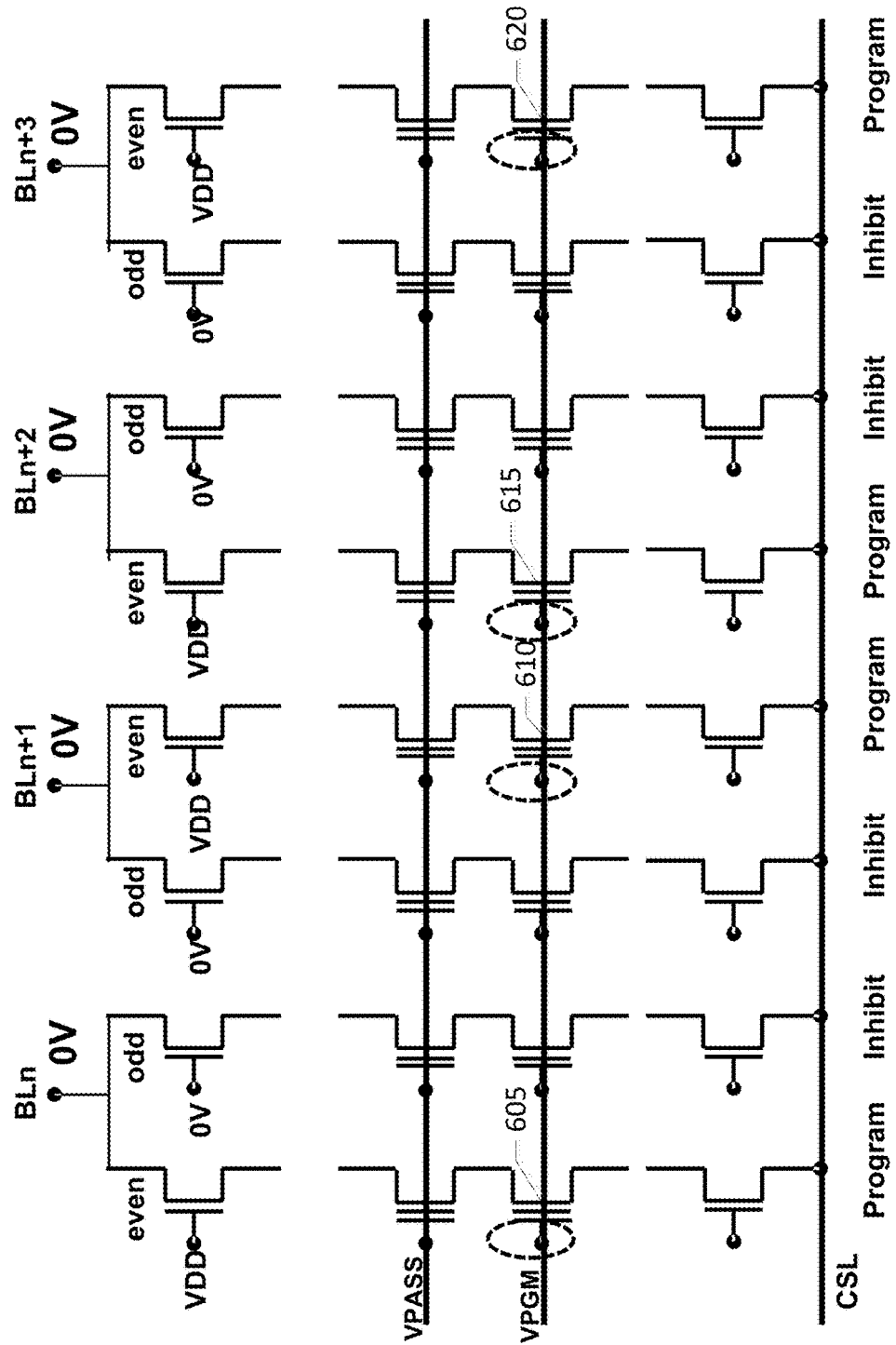
Figure 7:
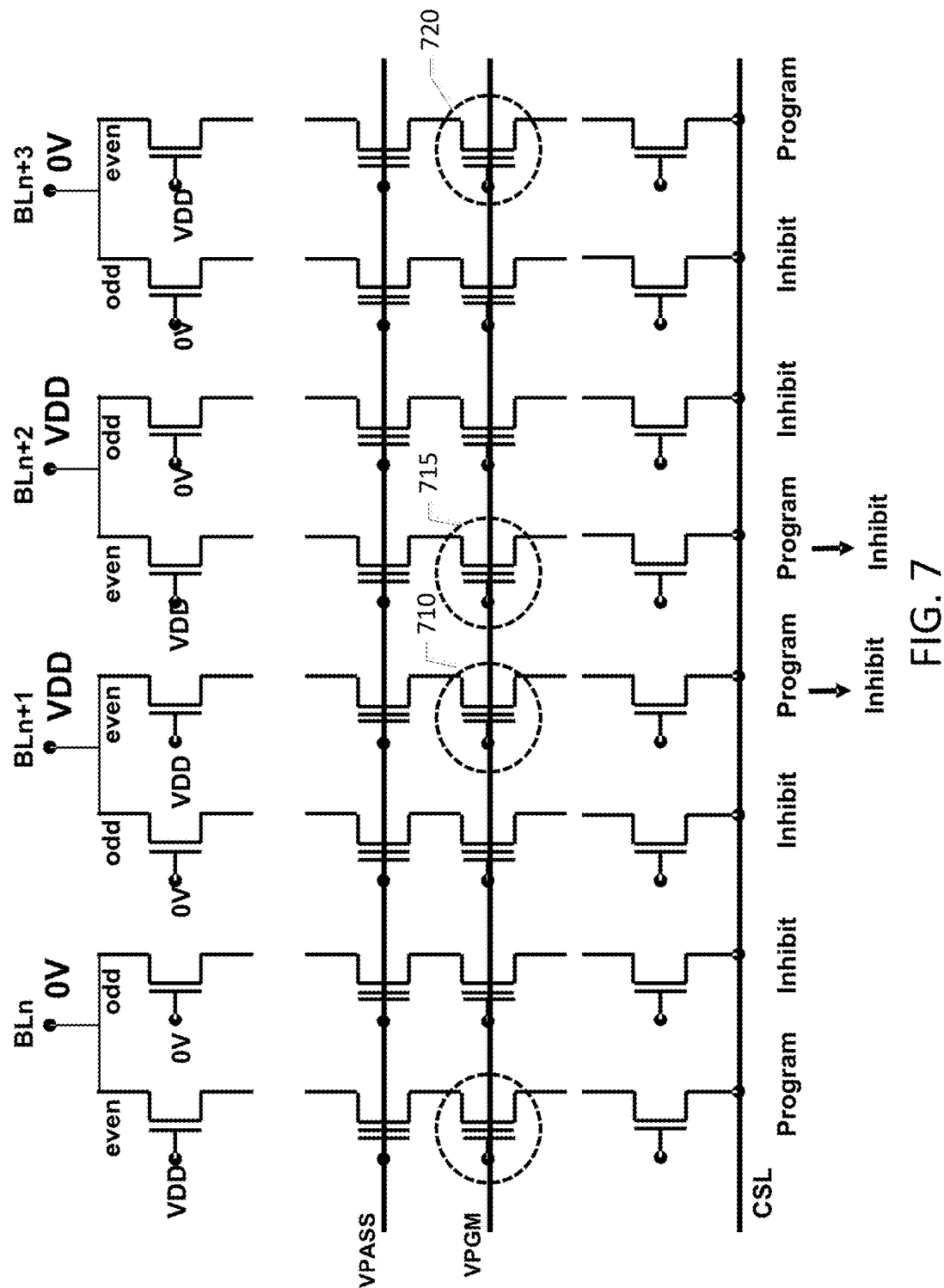
Figure 8:
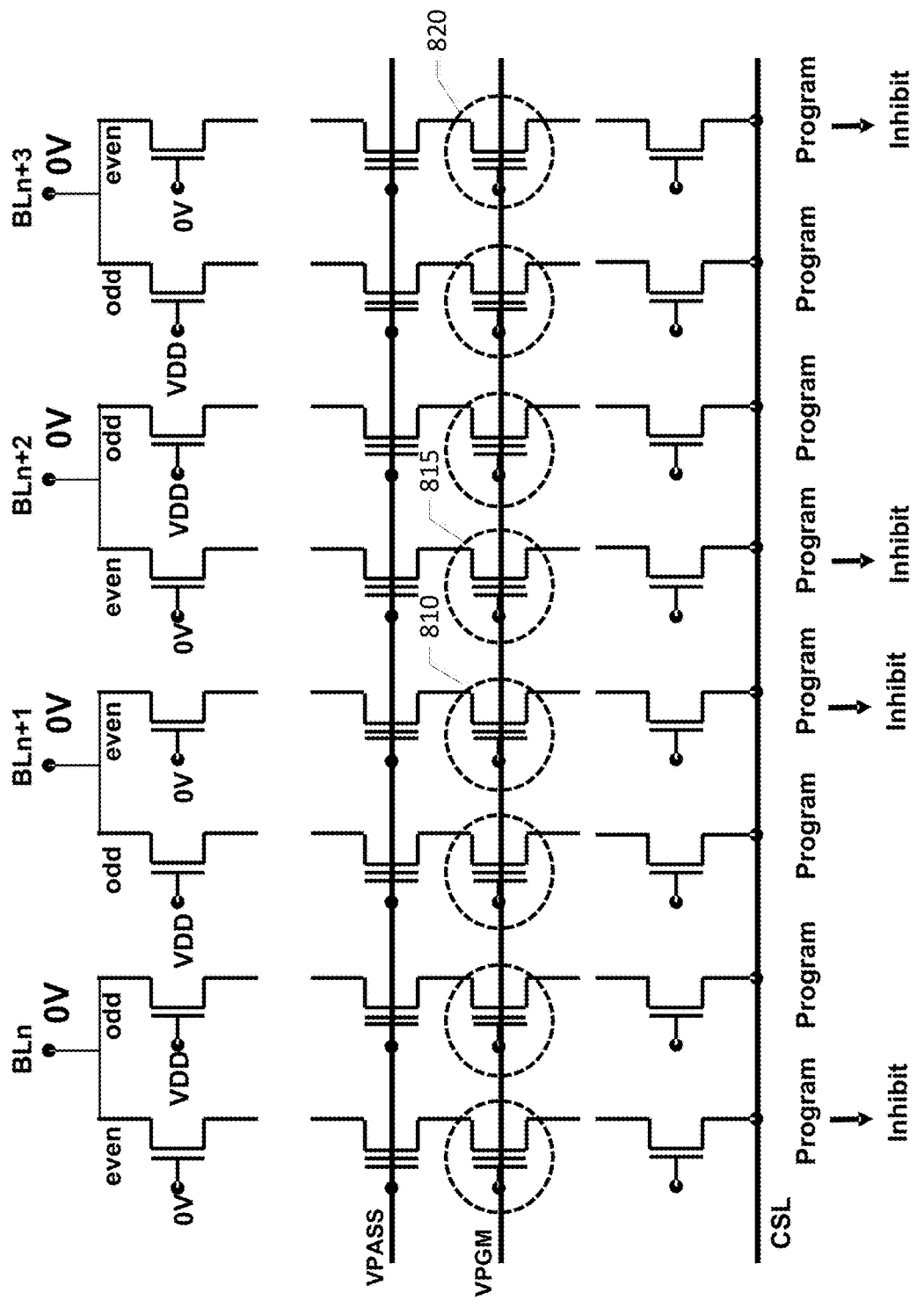
Figure 9:
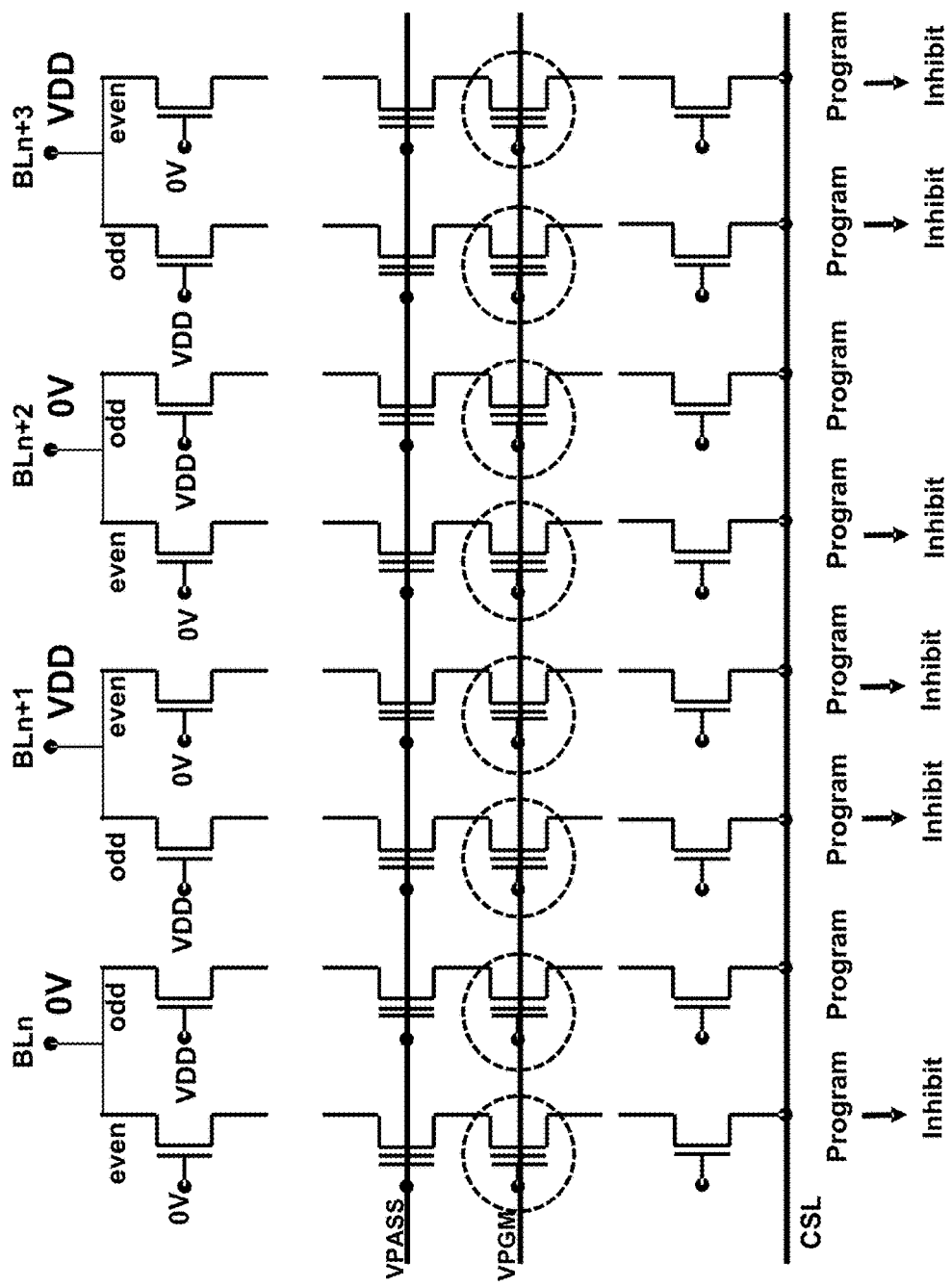
Figure 10:
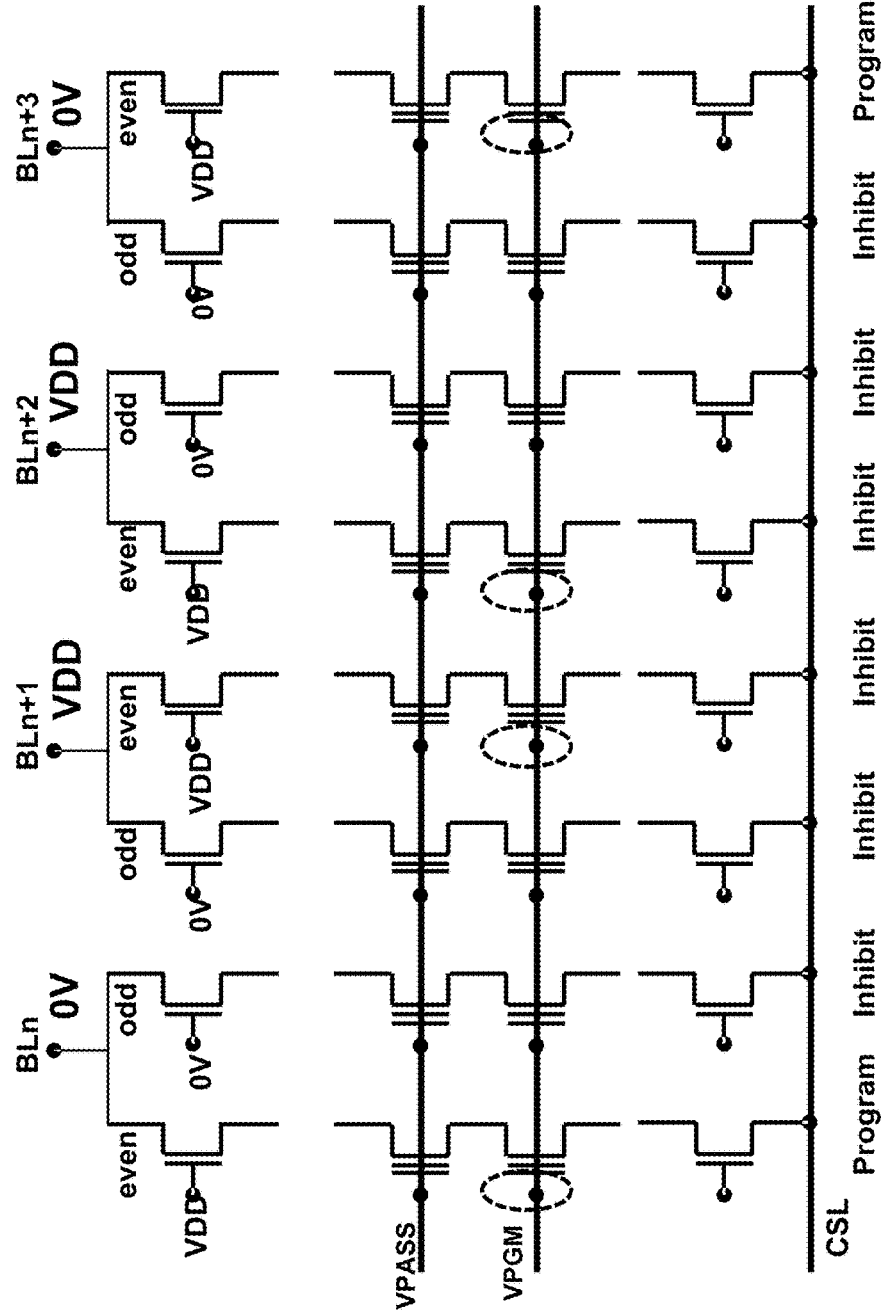
Figure 11A:
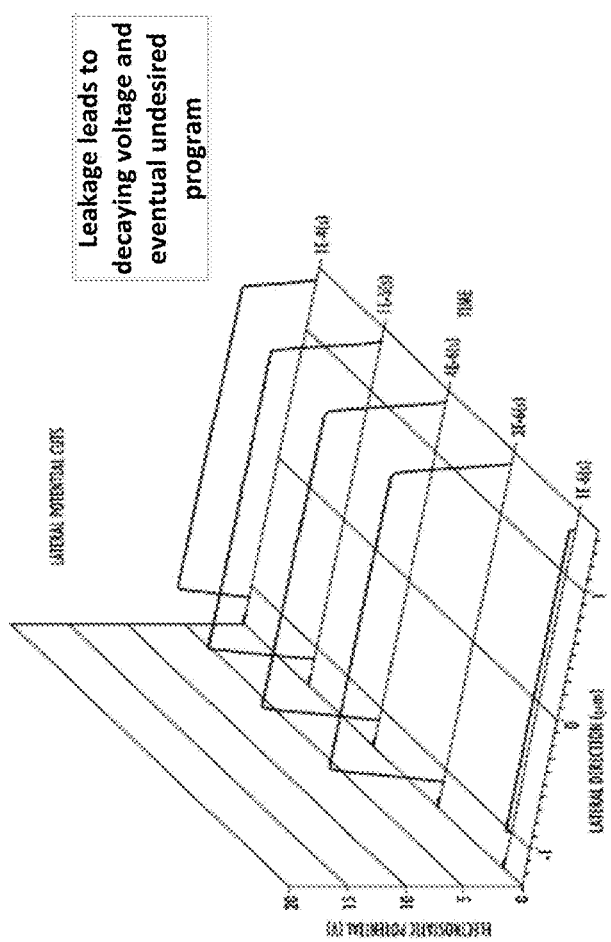
Figure 11B:
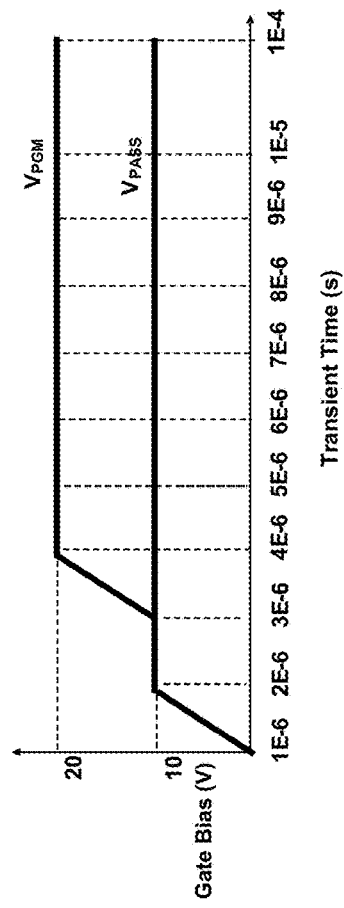
Figure 12:
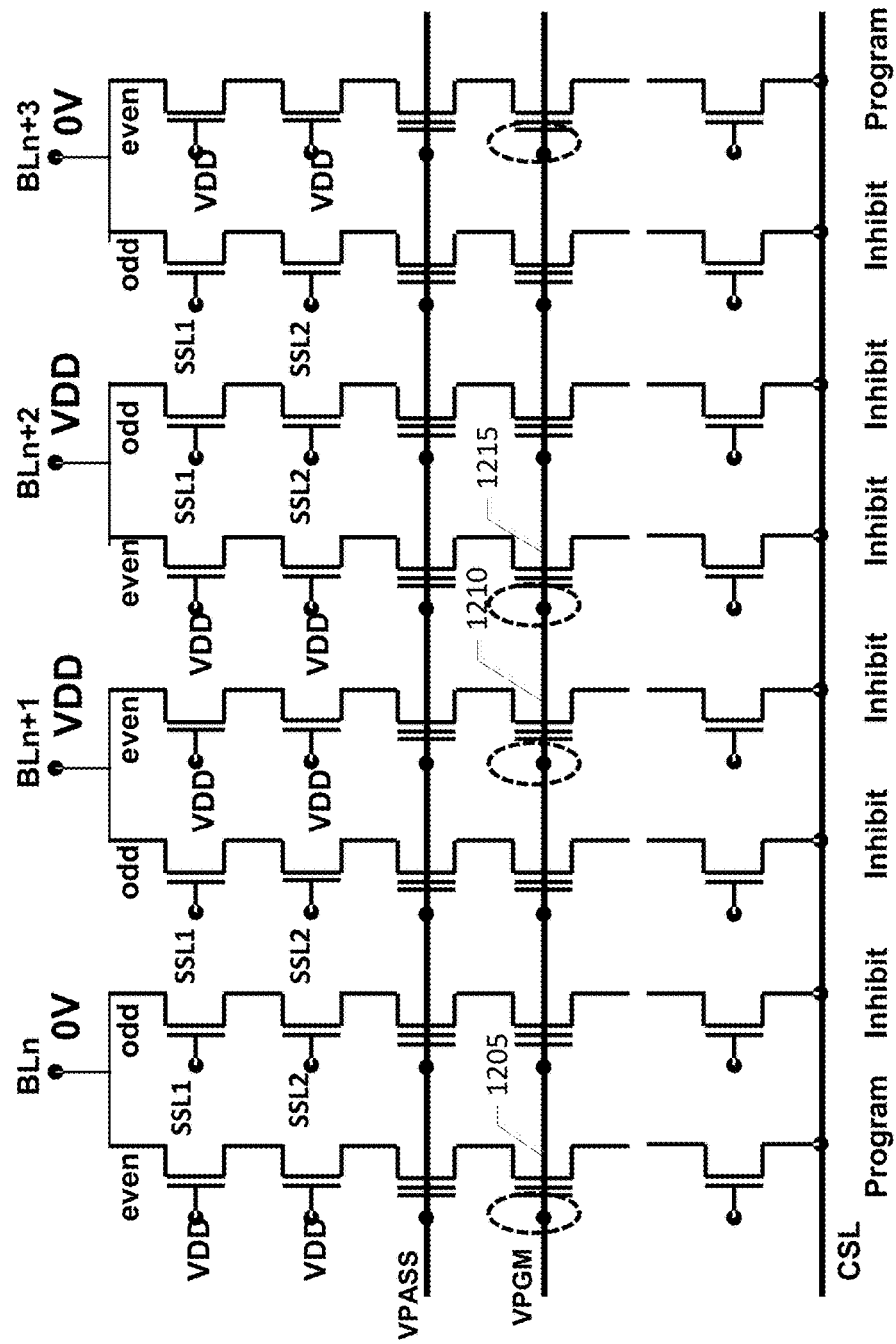
Figure 13:
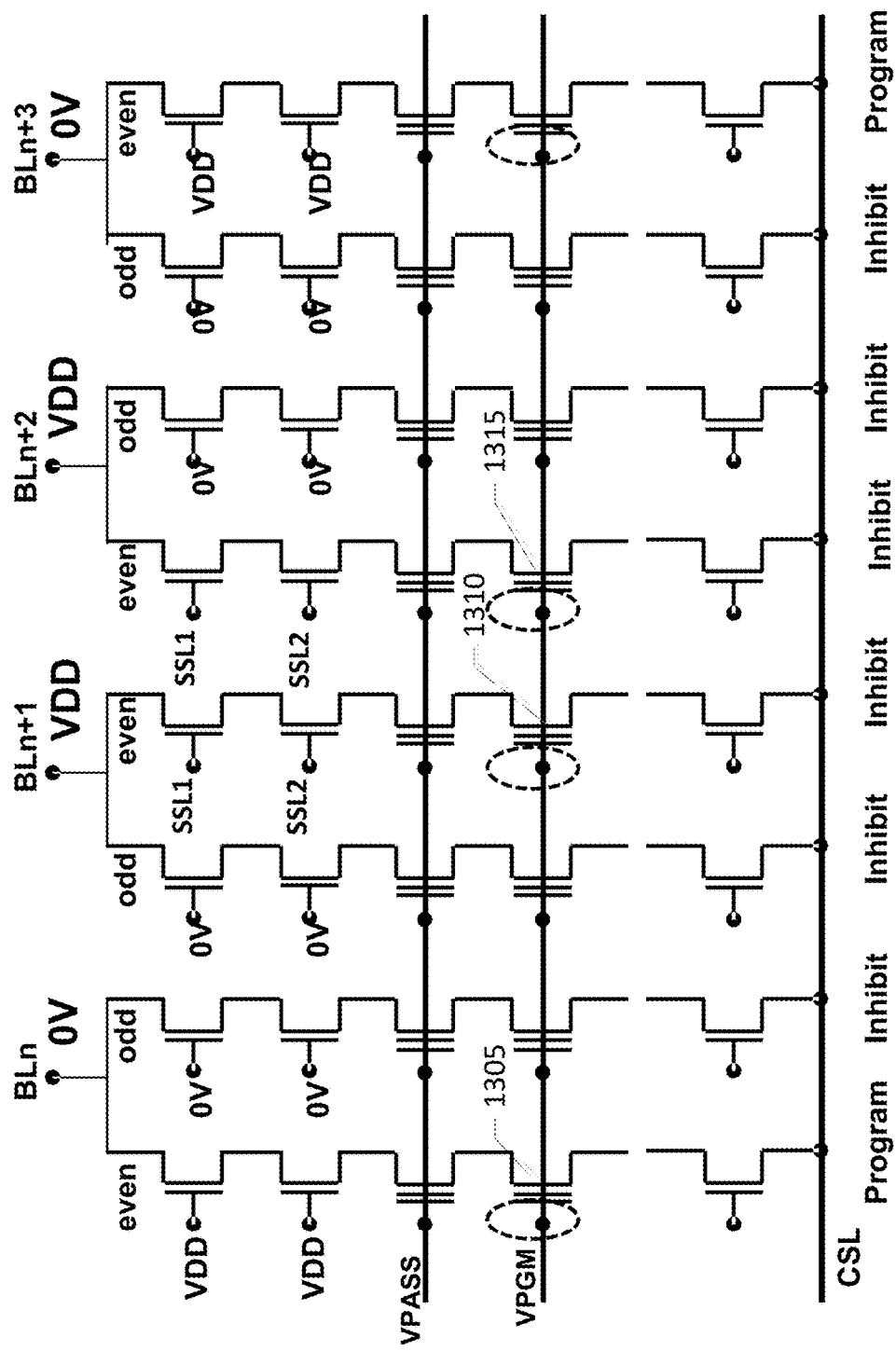
Figure 14:
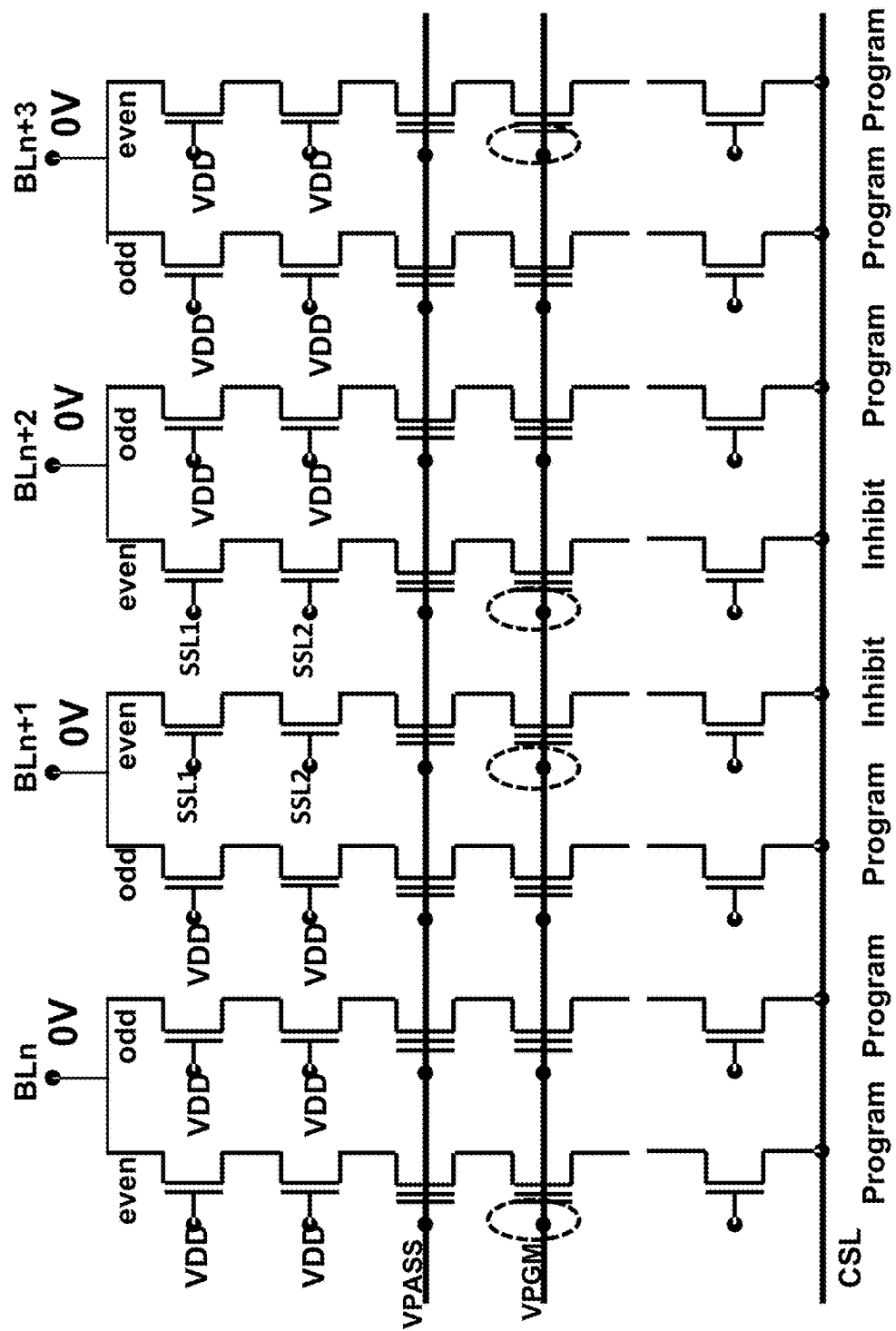
Figure 15:
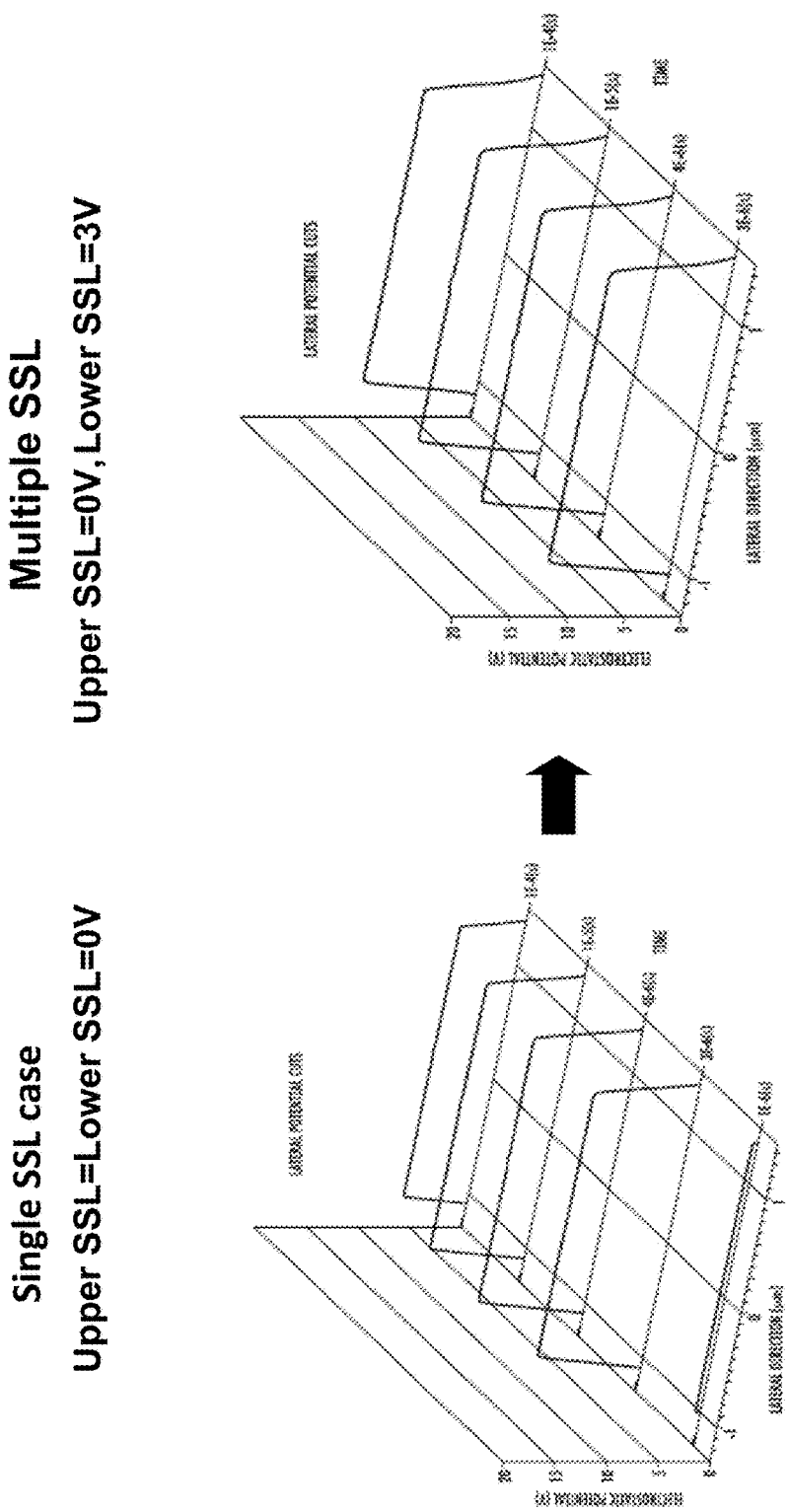
Figure 17:
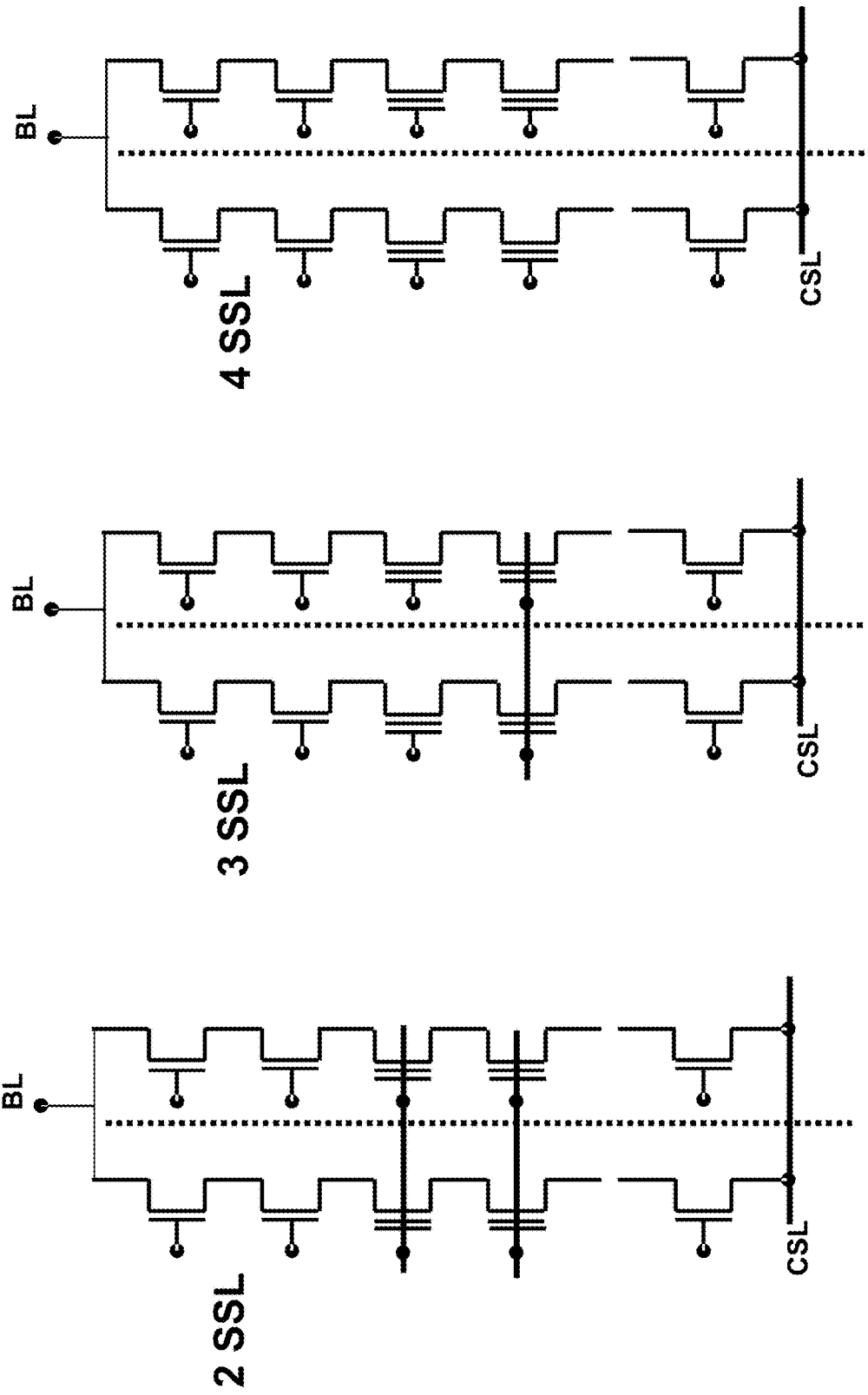
Figures 18A, 18B:
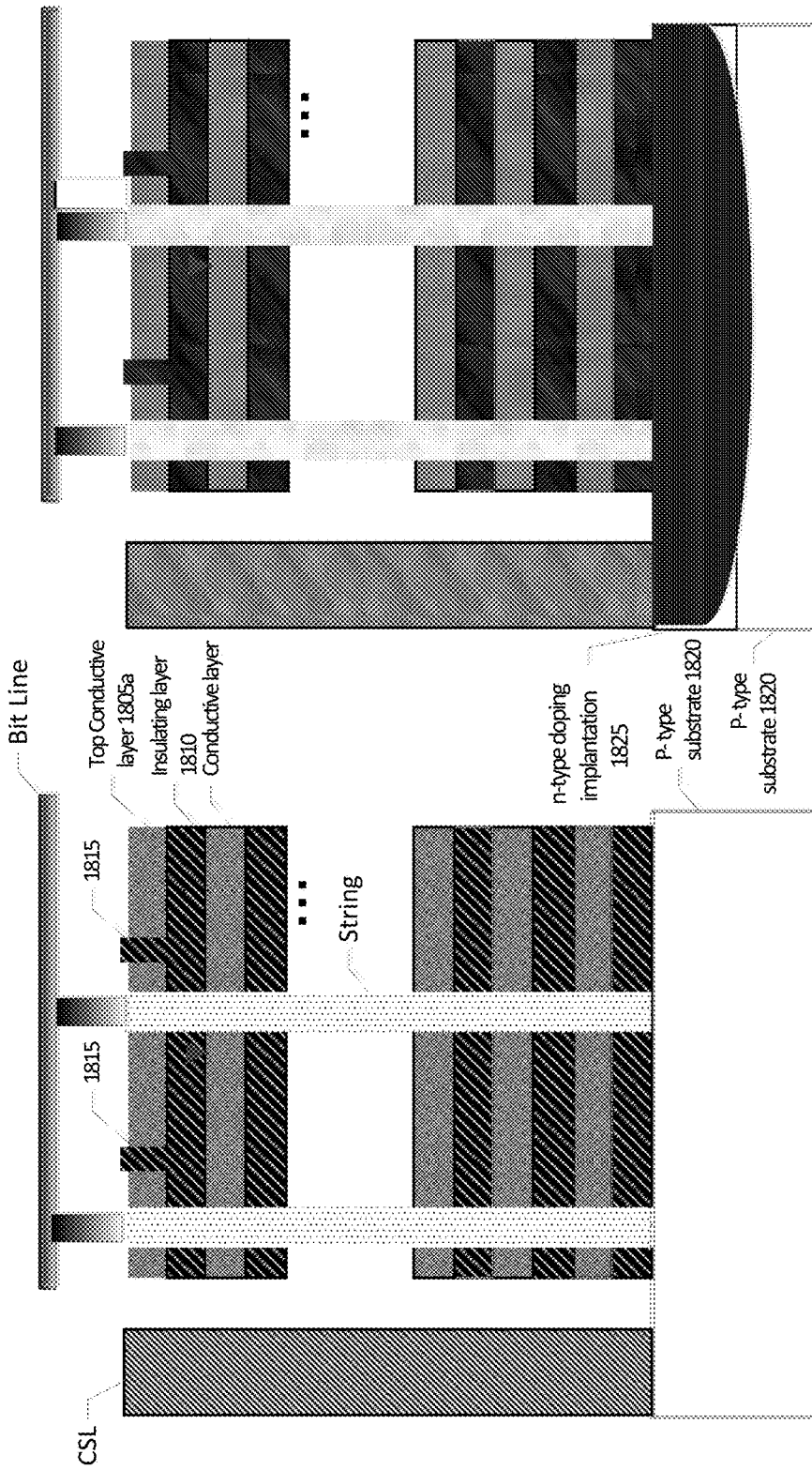

FIG. 2A a schematic diagram of a conventional two-dimensional NAND structure, in accordance with example embodiments of the present invention;

FIG. 2B shows a conventional three-dimensional application of a two-dimensional NAND structure, in accordance with example embodiments of the present invention; and FIG. 3 shows a schematic diagram of a two-dimensional NAND structure in accordance with example embodiments of the present invention;

FIG. 4 shows a schematic diagram of a three-dimensional NAND structure in accordance with example embodiments of the present invention;

FIG. 5A shows a top view of a substrate identifying a separation between the even and odd bit lines and one exemplary vertical channel array, in accordance with example embodiments of the present invention;

FIG. 5B shows a vertical channel string corresponding to FIG. 5A;

FIG. 6 shows a program operation of a selected cell using single string select line architecture, in accordance with example embodiments of the present invention;

FIG. 7 shows a program operation of a selected cell using single string select line architecture, in accordance with example embodiments of the present invention;

FIG. 8 shows a program operation of a selected cell using single string select line architecture, in accordance with example embodiments of the present invention;

FIG. 9 shows a program operation of a selected cell using single string select line architecture, in accordance with example embodiments of the present invention;

FIG. 10 shows a program operation of a selected cell using single string select line architecture, in accordance with example embodiments of the present invention;

FIG. 11A shows a graph illustrating the application of the transient pulse, in accordance with example embodiments of the present invention;

FIG. 11B shows a chart illustrating the lateral effect of leakage as time passes, in accordance with example embodiments of the present invention;

FIG. 12 shows a program operation of a selected cell using multiple string select line architecture, in accordance with example embodiments of the present invention;

FIG. 13 shows a program inhibit operation of a selected cell using multiple string select line architecture, in accordance with example embodiments of the present invention;

FIG. 14 shows a program inhibit operation of a selected cell using multiple string select line architecture, in accordance with example embodiments of the present invention;

FIG. 15 shows a graph illustrating the application of the transient pulse according to embodiments of the present invention;

FIG. 16A shows various top views of exemplary vertical channel hole layouts, in accordance with example embodiments of the present invention;

FIG. 16B shows various vertical channel hole shapes, in accordance with example embodiments of the present invention;

FIG. 17 shows schematic diagrams of a two-dimensional NAND structure in accordance with example embodiments of the present invention; and FIGS. 18A and 18B show exemplary alternative structures for implementing example embodiments of the present invention.

DETAILED DESCRIPTION

Some embodiments of the present invention will now be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

As used here, a "non-volatile memory device" refers to a semiconductor device which is able to store information even when the supply of electricity is removed. Non-volatile memory includes, without limitation, Mask Read-Only Memory, Programmable Read-Only Memory, Erasable Programmable Read-Only Memory, Electrically Erasable Programmable Read-Only Memory, and Flash Memory.

As used herein, a "substrate" may include any underlying material or materials upon which a device, a circuit, an epitaxial layer, or a semiconductor may be formed. Generally, a substrate may be used to define the layer or layers that underlie a semiconductor device or even forms the base layer of a semiconductor device. The substrate may include one or any combination of silicon, doped silicon, germanium, silicon germanium, semiconductor compounds, or other semiconductor materials.

Turning now to FIG. 1, a block diagram of an example semiconductor device 100 is provided. This example semiconductor device includes both a control circuit 102 and a series of nonvolatile memories 104. The control circuit 102 communicates with each of the nonvolatile memories 104 and is configured to direct the read, program, erase, and other operations applied to the memory elements. In turn, each nonvolatile memory 104 may include a matrix of memory cells arranged in rows and columns. For example, FIG. 2A shows a schematic diagram of a conventional two-dimensional NAND structure.

Each memory cell in the matrix includes a transistor structure having a gate, a drain, a source, and a channel defined between the drain and the source. Each memory cell is located at an intersection between a word line and a bit line, wherein the gate is connected to the word line, the drain is connected to the bit line, and the source is connected to a source line, which in turn is connected to common ground. The gate of a conventional flash memory cell generally comprises a dual-gate structure, including a control gate and a floating gate, wherein the floating gate is suspended between two oxide layers to trap electrons that program the cell. In some embodiments, each nonvolatile memory 104 may include a three-dimensional memory. FIG. 2B shows a conventional three-dimensional application of the two-dimensional NAND structure shown in FIG. 2A. FIG. 3 shows a schematic diagram of a two-dimensional NAND structure according to an embodiment of the present invention. FIG. 4 shows a schematic diagram of a three-dimensional NAND structure according to another embodiment of the present invention.

Conventional Architecture

As can be seen in FIG. 2A, in the conventional NAND Flash architecture, the cells are connected in series (e.g., typically in groups of 16 or 32). For example, an example matrix of memory cells is illustrated. This matrix of memory cells is part of a block within a nonvolatile memory device (such as one of nonvolatile memories 104 described in connection with FIG. 1, above). Each block of the nonvolatile memory device includes a plurality of word lines (of which WL . . . and $WL_n$ are illustrated in FIG. 2A) that intersect a sequence of odd and even bit lines. In FIG. 2A, the illustrated portion of the block illustrates one odd bit lines ($BL_o$) and two even bit lines ($BL_e$). A memory cell is located at each intersecting point of a word line and a bit line. Because there are n word lines and three bit lines shown, FIG. 2A illustrates $3n$ total memory cells.

Two selection transistors are placed at the edges of the stack, to ensure the connections to ground (through MGSL) and to the bitline (through MSSL). When a cell is read, its gate is set to 0V, while the other gates of the stack are biased with a high voltage (typically 4-5 V), so that they work as pass-transistor, regardless of their threshold voltage. An erased NAND Flash cell has a negative threshold voltage; on the contrary, a programmed cell has a positive threshold voltage but, in any case, less than 4V. In practice, driving the selected gate with 0V, the series of all the cells will sink current if the addressed cell is erased, otherwise no current is sunk if the cell is programmed.

FIG. 2B shows a convention three-dimensional application of the two-dimensional NAND structure shown in FIG. 2A. As shown, each NAND layer, one of which is shown in FIG. 2A, comprises a plurality of word lines (of which WL0 . . . and WL23 are illustrated in FIG. 2B) that intersect a sequence of odd and even bit lines (of which BL<p> . . . BL<q> are illustrated in FIG. 2B). Moreover, each NAND layer comprises a single SSL (SSL<0>, SSL<1>, and SSL<7> are illustrated in FIG. 2B).

Multiple String Select Lines

FIG. 3 shows a schematic diagram of a two-dimensional NAND structure according to an embodiment of the present invention. As shown, the two-dimensional architecture according to an embodiment of the present invention comprises a plurality of word lines (of which WLn−1 . . . and WLn are illustrated in FIG. 3) that intersect a sequence of odd and even bit lines (of which BLe . . . BLo are illustrated in FIG. 3).

In some embodiments, a plurality of SSLs may be provided. For example, FIG. 3 shows a plurality (e.g., 2) of SSLs (of which SSL(n−1) and SSL(n) are illustrated).

FIG. 4 shows a schematic diagram of a three-dimensional NAND structure according to another embodiment of the present invention.

Here, each NAND layer comprises a plurality of word lines (of which WLn−1 . . . and WLn are illustrated) that intersect a sequence of bit lines (of which BLe . . . BLo are illustrated). Moreover, each NAND layer comprises a plurality of SSLs (of which SSLn−1(0) and SSLn(1) are illustrated). While the words lines of each layer are electrically connected (i.e., each WLn, independent of layer, is the same voltage), the SSLs of each layer are not (i.e. SSLn(0) and SSL(1) are not electrically connected).

Programming

The "program operation" is the writing of the information in a memory cell and it is usually performed by transferring the electrons from the substrate of the cell into its floating gate. NAND flash memory devices program memory cells using Fowler-Nordheim tunneling. During programming the number of electrons that pass through the tunnel oxide depends on the electric field: the greater the electric field, the greater the probability of the injection of electrons.

In a NAND memory, a cell is a part of a string of cells, and this string can be selected by drain and source selectors. FIG. 5A shows a top view of the substrate identifying the separation between the even and odd bit lines as well as one exemplary vertical channel array, while FIG. 5B shows the corresponding vertical channel string. An even bit line may connect to each of the vertical channel strings identified in the even whereas an odd bit line is electrically connected to the odds. As such, odd channels and their corresponding strings share an odd bit line and accordingly a bias condition. Even channels and their corresponding strings share an even bit line and accordingly a bias condition.

FIG. 6 shows a program operation of a selected cell using single string select line architecture. To program a selected cell (e.g., cell 605), the corresponding drain selector is biased to VDD, the cells of the strings which should not be programmed are placed at Vpass (e.g., 8-10V), the gate of the source selector is at 0V, and the bitline is biased at 0V. The gate of the cell under programming may be set to Vpgm (e.g., 20V). That is, the cell under programming has 0V on the drain, and its source is floating, while there is a high voltage applied to its gate. The bitline of the selected cell is set to 0V or ground.

Here, cells sharing the same gate and the same bit line with the programmed cell undergo a program (e.g., cells 610, 615 and 620 are all programmed). To prevent cells sharing the same gate but not the same bit line with the programmed cell from undergoing an undesired program, their corresponding bit line is set to 0 and their corresponding SSL is set to 0, thus shutting off the cell.

FIG. 7 shows a program operation of a selected cell using single string select line architecture. Here, to prevent cells sharing the same gate and the same bit line with the programmed cell from undergoing an undesired program, their corresponding bit line is set to VDD, while their corresponding SSL is already set to VDD, thus shutting off the cell. To prevent cells sharing the same gate but not the same bit line with the programmed cell from undergoing an undesired program, their corresponding bit line is set to 0 and their corresponding SSL is set to 0, thus shutting off the cell.

FIG. 8 shows a program operation of a selected cell using single string select line architecture. Here, cells sharing the same gate and the same bit line with the programmed cell undergo a program (e.g., cells 810, 815 and 820 are all programmed). To prevent cells sharing the same gate but not the same bit line with the programmed cell from undergoing an undesired program, their corresponding bit line is set to 0 and their corresponding SSL is set to 0, thus shutting off the cell FIG. 9 shows a program operation of a selected cell using single string select line architecture. Here, to prevent cells sharing the same gate and the same bit line with the programmed cell from undergoing an undesired program, their corresponding bit line is set to VDD, while their corresponding SSL is already set to VDD, thus shutting off the cell. To prevent cells sharing the same gate but not the same bit line with the programmed cell from undergoing an undesired program, their corresponding bit line is set to 0 and their corresponding SSL is set to 0, thus shutting off the cell.

FIG. 10 shows a program operation of a selected cell using single string select line architecture and is illustrated to provide context to the improved operation of embodiments of the present invention, specifically, multiple strings select lines. FIG. 10 shows the same architecture as FIG. 7. That is, FIG. 10 shows bit lines in the same block with a different bias. That is, BLn and BLn+1 are biased differently (e.g., BLn=0V and BLn+1=VDD), and in the program operation as described above, issues related to program and pass disturb may be encountered.

Program disturb applies to the cells sharing the word line with the selected cells but are set to program inhibit. Program disturb may be reduced by increasing Vpass at the expense of an increased pass disturb. Pass disturb applies to the cells located in the same NAND string as a selected cell. In this case, the channel potential is set to ground and the gate nodes are set to the Vpass voltage. Therefore the effective programming voltage for these cells is Vpass. However, program inhibit is based on boosting the potential of the floating channel to higher voltages (i.e. a higher Vpass) to reduce the electric field at the tunneling dielectric (TD) and therefore preventing charge injection. However, this method is vulnerable to leakages.

As such, a compromise is often made. For example, the gate of the unselected cells may be biased at a voltage between, for example, 8V and 10V. The boost on the channel is directly proportional to this value: the greater it is, the greater and the longer the boost can be kept. However, the choice of this voltage is a critical point: too high a value increases the probability that cells sharing the same string of the selected cell will suffer a program operation (i.e. pass disturbance); too low a value could not guarantee that the boost will be high enough and last for the entire program operation, programming the cells placed on the same row as the selected one (i.e. program disturbance).

FIG. 11A shows a graph illustrating the application of the transient pulse. FIG. 11B shows a chart illustrating the gate bias of word lines (Vpgm and Vpass) as time passes. As can be seen, the electrostatic potential starts low at 1E-6 and increases to 10V corresponding to the application of the Vpass transient pulse at 3E-6. The electrostatic potential remains at 10V at 4E-6 when the Vpgm is applied. At 1E-5, leakage is occurring and as such the electrostatic potential is down to below 10. 1E-4, while Vpgm is still being applied, the electrostatic potential has fallen to around 6V. That is, leakage leads to decaying voltage and, in some embodiments, an undesired program operation.

Conventionally, Vpass may be kept low to avoid pass disturb. However, a low Vpass leads to low boosted potential. Furthermore, leakage during program inhibit will degrade channel potential and cause undesired program operation. Therefore, a method for keeping channel potential high is desired.

Programming with Multiple String Select Lines

Generally, a non-volatile memory device having multiple string select lines is provided. Given the multiple string select line (SSL) structure, during a program inhibit process, a relatively smaller leakage may be achieved, resulting in a boosting potential that can be kept at a desired level without dropping, resulting in the prevention of unselected cells from being programmed. Moreover, improved boosting potential may lead to less program disturbance and an enlarged memory window.

More specifically, a non-volatile memory device may be provided, the device comprising a 3D array of nonvolatile memory cells. In some embodiments, the 3D array may include one or more layers, each layer comprising a plurality of NAND strings of nonvolatile memory cells, a plurality of SSLs, and one or more word lines. Each of plurality of NAND strings may be coupled to a bit line, and in some embodiments, the plurality of SSLs and word lines are arranged orthogonally to the plurality of NAND strings. The one more word lines may establish the nonvolatile memory cells at cross-points between surfaces of the plurality of stacks and the one or more word lines. Each of the plurality of NAND strings may further comprise a plurality of string-select-line (SSL) transistors coupling the SSLs to the NAND strings. In some embodiments, at least a first SSL may be configured to receive a first voltage and a second SSL may be configured to receive a second voltage, the second SSL being nearer to the one or more word lines.

A. Bitlines in the Same Block with Different Bias

FIG. 12 shows a program operation of a selected cell using multiple string select line architecture. To program a selected cell (e.g., cell 1205), the corresponding drain selector(s) is biased to VDD, the cells of the strings which should not be programmed are placed at Vpass (e.g., 8-10V), the gate of the source selector is at 0V, and the bitline is biased at 0V. The gate of the cell under programming may be set to Vpgm (e.g., 20V). The bitline of the selected cell is set to 0V or ground.

Here, to prevent cells sharing the same gate and the same bit line with the programmed cell from undergoing an undesired program, their corresponding bit line may be set to VDD, while their corresponding SSL is already set to VDD, thus shutting off the cell (see cells 1210 and 1215). To prevent cells sharing the same gate but not the same bit line with the programmed cell from undergoing an undesired program, their corresponding bit line is set to 0 and the first corresponding SSL is set to 0, thus shutting off the cell. In some embodiments, the second SSL may be set to 0 also, as is conventionally done (which as discussed may lead to program and pass disturbance.)

To prevent or reduce leakage (thus increasing the memory window and reducing program disturbance), the second SSL may be set to VDD', where VDD' is greater than zero but less than VDD. By setting the second SSL to VDD', the floating channel potential is now not zero (e.g., 3.3V, 5V, etc.) at the second SSL, thus reducing the channel potential gradient between SSL and bit line and, thus leakage due to steep channel potential gradient and an undesired program operation.

Accordingly, where leakage is kept small, boosting potential can be kept where at the desired level (e.g., 10V) without dropping, which leads to an enlarged memory window.

B. Bitlines in the Same Block have Same Bias of VDD

FIG. 13 shows a program inhibit operation of a selected cell using multiple string select line architecture. To program a selected cell (e.g., cell 1305), the corresponding drain selector(s) is biased to VDD, the cells of the strings which should not be programmed are placed at Vpass (e.g., 8-10V), the gate of the source selector is at 0V, and the bitline is biased at 0V. The gate of the cell under programming may be set to Vpgm (e.g., 20V). The bitline of the selected cell is set to 0V or ground.

Here, to prevent cells sharing the same gate but not the same bit line (their corresponding bit line is set to VDD while the bit line of the selected cell is set to 0) with the programmed cell from undergoing an undesired program, their corresponding SSL must be set to a voltage enabling program of the selected cell, such as VDD, while still shutting off the unselected cells (see cells 1310 and 1315). In some embodiments, SSL1 may be set to VDD, while SSL2 is set to a voltage less than VDD but greater than zero, thus the leaving the source floating at a higher than zero voltage (e.g., 3.3V). In other embodiments, SSL1 may be VDD and SSL2 may be VDD. In another embodiments, SSL1 may be VDD' and SSL2 may be VDD' also.

C. Bitlines in the Same Block have Same Bias of 0

FIG. 14 shows a program inhibit operation of a selected cell using multiple string select line architecture. To program a selected cell (e.g., cell 1405), the corresponding drain selector(s) is biased to VDD, the cells of the strings which should not be programmed are placed at Vpass (e.g., 8-10V), the gate of the source selector is at 0V, and the bitline is biased at 0V. The gate of the cell under programming may be set to Vpgm (e.g., 20V). GND on the bitline to be programmed.

Here, to prevent cells sharing the same gate but not the same bit line (their corresponding bit line is set to 0) with the programmed cell from undergoing an undesired program, their corresponding SSL must be set to a voltage enabling program of the selected cell, such as VDD, while still shutting off the unselected cells (see cells 1410 and 1415). In some embodiments, SSL1 may be set to 0, while SSL2 is set to 0 also. In other embodiments, SSL1 may be set to 0, while SSL2 is set to a voltage less than VDD but greater than zero, thus the leaving the SSL channel potential floating at a higher than zero voltage (e.g., 3.3V).

FIG. 15 shows a graph illustrating the application of the transient pulse according to embodiments of the present invention. Specifically, FIG. 15 shows, on the left, a chart illustrating the lateral effect of leakage as time passes, as shown in FIG. 11A, and a chart illustrating the lateral effect of leakage as time passes according embodiments of the present invention. As can be seen, while, in the chart on the left, the electrostatic potential begins to fall after Vpgm is applied as (at 1E-5) leakage is occurring, which may result in an undesired program operation, in embodiments of the present invention, the electrostatic potential remains high, resulting in boosted potential being larger for multiple SSL embodiments, which may result in less PGM disturbance.

ALTERNATIVES

It should be understood that while the present invention is described for clarity using the vertical channel hole array shown in FIG. 5A, in the nonvolatile memory device, the nonvolatile memory device may contain any number of other vertical channel hole array configurations or shapes in embodiments. For example, FIG. 16A shows various top views of other exemplary vertical channel hole layouts and FIG. 16B shows various vertical channel hole shapes. Furthermore, although some embodiments of the present invention comprise or utilize two string select lines in NAND flash memory device, embodiments of the present invention may comprise or utilize any number of string select lines (e.g., 3, 4, 5, etc.). For example, FIG. 17 shows embodiments of the present invention comprising three string select lines, four string select lines, and five string select lines. Furthermore, although some embodiments of the present invention comprise or utilize a NAND flash memory device, embodiments of the present invention may comprise or utilize other nonvolatile semiconductor devices, such as NOR flash memory or the like.

Furthermore, in some embodiments of the present invention may be implemented on a structure such as that shown in FIG. 18A or FIG. 18B. That is, embodiments of the present invention may be provided utilizing an apparatus comprising a 3D array of nonvolatile memory cells, the 3D array including a plurality of conductive layers 1805 separated from each other by insulating layers 1810, the plurality of conductive layers comprising a top layer or layers 1805a and one or more bottom layers 1805b, the top layer or layers comprising n string select lines (SSLs), wherein the top layer or layers 1805a further comprising n−1 cuts 1815 filled with insulating material, each cut electrically separating two SSLs, wherein each cut is cut to a depth of the top layer or layers 1805a thus not extending into the bottom layers 1820. In some embodiments, the apparatus further comprises a 3D NAND device comprising at least one of an n-type doped substrate formed by n-type dopant implantation, a p-type doped substrate, or an undoped substrate. For example, FIG. 18A shows an embodiment of the present invention comprising a p-type doped substrate 1820. FIG. 18B shows an embodiment of the present invention comprising a 3D NAND device comprising at least one of an n-type doped substrate 1825 formed by n-type dopant implantation. Both FIGS. 18A and 18B show embodiments Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for controlling a non-volatile memory device, the apparatus comprising:
a 3D array of nonvolatile memory cells, the 3D array including:
a plurality of layers, each layer comprising (1) a plurality of NAND strings of nonvolatile memory cells, each of plurality of NAND strings coupled to a bit line and (2) a plurality of string select lines (SSL) and one or more word lines, the plurality of SSLs and the one or more word lines arranged orthogonally to the plurality of NAND strings, the plurality of string select lines (SSL) connected to the bit line,
the one more word lines establishing the nonvolatile memory cells at cross-points between surfaces of the plurality of stacks and the one or more word lines,
each of the plurality of NAND strings further comprising a plurality of string-select-line (SSL) transistors coupling the SSLs to the NAND strings,
a first SSL transistor and a second SSL transistor forming a SSL string adjacent to a second SSL string comprised of an SSL transistor sharing a bias condition with the first SSL transistor and another SSL transistor sharing a bias condition with the second SSL transistor and repeated every four bit lines,
wherein at least a first SSL being configured to receive a first voltage and a second SSL configured to receive a second voltage, a first SSL string belonging to a first bit line and a second SSL string belonging to a second bit line, the second bit line being adjacent to the first bit line, the first SSL string and the second SSL string forming a SSL string pair which is separated from a second SSL sting pair by a SSL string pair biasing with VDD, the first voltage and the second voltage being different than VDD, and
wherein the second SSL being nearer to the one or more word lines.

2. The apparatus according to claim 1, further comprising:
a control circuit configured to inhibit programming cells sharing a word line and not sharing a bit line, the bit lines having a different bias, by applying a first voltage to the first SSL and a second voltage to the second SSL, the second SSL being nearer to the word line, and the first voltage being 0 voltage and the second voltage being lower than the VDD voltage and greater than 0.

3. The apparatus according to claim 1, further comprising:
a control circuit configured to inhibit programming cells sharing a word line and sharing the bitline, the bit line being VDD, by applying a first voltage to the first SSL transistor and a second voltage to the second SSL, the second SSL being nearer to the word line, and the first voltage being VDD voltage and the second voltage being lower than the VDD voltage and greater than 0.

4. The apparatus according to claim 1, further comprising:
a control circuit configured to inhibit programming cells sharing a word line and sharing the bitline, the bit line being 0, by applying a first voltage to the first SSL transistor and a second voltage to the second SSL, the second SSL being nearer to the word line, and the first voltage being 0 voltage and the second voltage being lower than the VDD voltage and greater than 0.

5. The apparatus according to claim 1, wherein the non-volatile memory device is a vertical channel-type three-dimensional semiconductor memory device comprising a substrate and a plurality of through-holes.

6. The apparatus according to claim 5, wherein each of the plurality of NAND strings of nonvolatile memory cells memory cells being associated with an even bit line or an odd bit line, and each of the plurality of NAND strings associated with the even bit line can be programmed independent of the plurality of NAND strings associated with the odd bit line.

7. The apparatus according claim 1, wherein the non-volatile memory device comprises a flash memory.

8. The apparatus according claim 1, wherein the non-volatile memory device comprises a NAND flash memory.

9. The apparatus according claim 1, further comprising: a 3D NAND device comprising at least one of an n-type doped substrate formed by n-type dopant implantation, a p-type doped substrate, or an undoped substrate.

10. A non-volatile memory device:
a 3D array of nonvolatile memory cells, the 3D array including:
a plurality of layers, each layer comprising (1) a plurality of NAND strings of nonvolatile memory cells, each of plurality of NAND strings coupled to a bit line and (2) a plurality of string select lines (SSL) and one or more word lines, the plurality of SSLs and the one or more word lines arranged orthogonally to the plurality of NAND strings, the plurality of string select lines (SSL) connected to the bit line,
the one more word lines establishing the nonvolatile memory cells at cross-points between surfaces of the plurality of stacks and the one or more word lines,
each of the plurality of NAND strings further comprising a plurality of string-select-line (SSL) transistors coupling the SSLs to the NAND strings,
a first SSL transistor and a second SSL transistor forming a SSL string adjacent to a second SSL string comprised of an SSL transistor sharing a bias condition with the first SSL transistor and another SSL transistor sharing a bias condition with the second SSL transistor and repeated every four bit lines,
wherein at least a first SSL being configured to receive a first voltage and a second SSL configured to receive a second voltage, a first SSL string belonging to a first bit line and a second SSL string belonging to a second bit line, the second bit line being adjacent to the first bit line, the first SSL string and the second SSL string forming a SSL string pair which is separated from a second SSL sting pair by a SSL string pair biasing with VDD, the first voltage and the second voltage being different than VDD, and
wherein the second SSL being nearer to the one or more word lines.

11. The nonvolatile memory device of claim 10, further comprising:
a control circuit configured to inhibit programming cells sharing a word line and not sharing a bit line, the bit lines having a different bias, by applying a first voltage to the first SSL and a second voltage to the second SSL, the second SSL being nearer to the word line, and the first voltage being 0 voltage and the second voltage being lower than the VDD voltage and greater than 0.

12. The nonvolatile memory device of claim 10, further comprising:
a control circuit configured to inhibit programming cells sharing a word line and sharing the bitline, the bit line being VDD, by applying a first voltage to the first SSL transistor and a second voltage to the second SSL, the second SSL being nearer to the word line, and the first voltage being VDD voltage and the second voltage being lower than the VDD voltage and greater than 0.

13. The nonvolatile memory device of claim 10, further comprising:
a control circuit configured inhibit programming cells sharing a word line and sharing the bitline, the bit line being 0, by applying a first voltage to the first SSL transistor and a second voltage to the second SSL, the second SSL being nearer to the word line, and the first voltage being 0 voltage and the second voltage being lower than the VDD voltage and greater than 0.

14. The nonvolatile memory device of claim 10, wherein the non-volatile memory device is a vertical channel-type three-dimensional semiconductor memory device comprising a substrate and a plurality of through-holes.

15. The nonvolatile memory device of claim 10, wherein each of the plurality of NAND strings of nonvolatile memory cells memory cells being associated with an even bit line or an odd bit line, and each of the plurality of NAND strings associated with the even bit line can be programmed independent of the plurality of NAND strings associated with the odd bit line.

16. The nonvolatile memory device of claim 10, wherein the nonvolatile memory device comprises a flash memory.

17. The nonvolatile memory device of claim 10, wherein the nonvolatile memory device comprises a NAND flash memory.

18. The nonvolatile memory device of claim 10, further comprising: a 3D NAND device comprising at least one of an n-type doped substrate formed by n-type dopant implantation, a p-type doped substrate, or an undoped substrate.

19. A method for controlling a nonvolatile memory device, the method comprising:
providing a nonvolatile memory device that includes a 3D array of nonvolatile memory cells, the 3D array including:
a plurality of layers, each layer comprising (1) a plurality of NAND strings of nonvolatile memory cells, each of plurality of NAND strings coupled to a bit line and (2) a plurality of string select lines (SSL) and one or more word lines,
the plurality of SSLs and the one or more word lines arranged orthogonally to the plurality of NAND strings, the plurality of string select lines (SSL) connected to the bit line,
the one more word lines establishing the nonvolatile memory cells at cross-points between surfaces of the plurality of stacks and the one or more word lines,
each of the plurality of NAND strings further comprising a plurality of string-select-line (SSL) transistors coupling the SSLs to the NAND strings,
a first SSL transistor and a second SSL transistor forming a SSL string adjacent to a second SSL string comprised of an SSL transistor sharing a bias condition with the first SSL transistor and another SSL transistor sharing a bias condition with the second SSL transistor and repeated every four bit lines,
wherein at least a first SSL being configured to receive a first voltage and a second SSL configured to receive a second voltage, a first SSL string belonging to a first bit line and a second SSL string belonging to a second bit line, the second bit line being adjacent to the first bit line, the first SSL string and the second SSL string forming a SSL string pair which is separated from a second SSL sting pair by a SSL string pair biasing with VDD, the first voltage and the second voltage being different than VDD, and
wherein the second SSL being nearer to the one or more word lines.

20. The method according to claim 19, further comprising:
providing a control circuit configured to inhibit programming cells sharing a word line and not sharing a bit line, the bit lines having a different bias, by applying a first voltage to the first SSL and a second voltage to the second SSL, the second SSL being nearer to the word line, and the first voltage being 0 voltage and the second voltage being lower than the VDD voltage and greater than 0.

21. The method according to claim 19, further comprising:
providing a control circuit configured to inhibit programming cells sharing a word line and sharing the bitline, the bit line being VDD, by applying a first voltage to the first SSL transistor and a second voltage to the second SSL, the second SSL being nearer to the word line, and the first voltage being VDD voltage and the second voltage being lower than the VDD voltage and greater than 0.

22. The method according to claim 19, further comprising:
providing a control circuit configured to inhibit programming cells sharing a word line and sharing the bitline, the bit line being 0, by applying a first voltage to the first SSL transistor and a second voltage to the second SSL, the second SSL being nearer to the word line, and the first voltage being 0 voltage and the second voltage being lower than the VDD voltage and greater than 0.

23. The method according to claim 19, wherein the providing of the non-volatile memory device further comprises providing a 3D NAND device comprising at least one of an n-type doped substrate formed by n-type dopant implantation, a p-type doped substrate, or an undoped substrate.

* * * * *